United States Patent
Michael et al.

(10) Patent No.: US 10,170,166 B1
(45) Date of Patent: Jan. 1, 2019

(54) DATA TRANSMISSION APPARATUS FOR MEMORY AND DATA TRANSMISSION METHOD THEREOF

(71) Applicant: Winbond Electronics Corp., Taichung (TW)

(72) Inventors: Oron Michael, San Jose, CA (US);
Poongyeub Lee, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/698,657

(22) Filed: Sep. 8, 2017

(51) Int. Cl.
  *G11C 7/10* (2006.01)
  *G11C 7/06* (2006.01)
  *G11C 7/22* (2006.01)

(52) U.S. Cl.
  CPC .............. *G11C 7/106* (2013.01); *G11C 7/065* (2013.01); *G11C 7/1006* (2013.01); *G11C 7/1051* (2013.01); *G11C 7/22* (2013.01)

(58) Field of Classification Search
  CPC ........... G11C 7/106; G11C 7/065; G11C 7/10; G11C 7/06; G11C 7/1072; G11C 11/4093; G11C 7/1051; G11C 7/22
  USPC ............. 365/78, 185.12, 291–221, 239, 240, 365/189.17; 326/38, 86, 104
  See application file for complete search history.

(56) References Cited

U.S. PATENT DOCUMENTS

| | | | |
|---|---|---|---|
| 5,402,389 A * | 3/1995 | Flannagan | G11C 7/1039 365/189.12 |
| 6,343,041 B1 * | 1/2002 | Kanazashi | G11C 7/1006 365/189.12 |
| 7,492,185 B1 | 2/2009 | Huang et al. | |
| 8,261,004 B2 * | 9/2012 | Chung | G11C 5/02 710/36 |
| 8,321,713 B2 | 11/2012 | Nobunaga | |
| 9,224,438 B2 | 12/2015 | Lee et al. | |
| 9,548,088 B2 | 1/2017 | Mes | |
| 2002/0057614 A1 * | 5/2002 | Kanazashi | G11C 7/1006 365/219 |

(Continued)

FOREIGN PATENT DOCUMENTS

TW       525187       3/2003

OTHER PUBLICATIONS

Johnny Chan, et al., "Method and Apparatus for Serial Data Output in Memory Device," Unpublished U.S. Appl. No. 15/213,714, filed Jul. 19, 2016, The specification, claims, and the drawings of the unpublished pending U.S. application have been stored in the Image File Wrapper (IFW) system.

*Primary Examiner* — Gene Auduong
(74) *Attorney, Agent, or Firm* — JCIPRNET

(57) ABSTRACT

The data transmission apparatus includes a prior stage shift register circuit and a plurality of rear stage shift register circuits. The prior stage shift register circuit is coupled to a sense amplifying device of the memory, receives sensed data from the sense amplifying device and outputs a plurality of the readout data in series by bitwise shifting out the sensed data according to a shift clock signal. The plurality of rear stage shift register circuits are coupled to the prior stage shift register circuit and respectively coupled to a plurality of pads. The plurality of rear stage shift register circuits respectively receive the readout data and respectively bitwise transport the readout data to the pads according to a clock signal. Wherein, a frequency of the shift clock signal is less than a frequency of the clock signal.

12 Claims, 5 Drawing Sheets

(56) References Cited

U.S. PATENT DOCUMENTS

2004/0153902 A1    8/2004  Machado et al.
2014/0192583 A1*   7/2014  Rajan .................... G11C 7/10
                                                    365/63

* cited by examiner

DATA TRANSMISSION APPARATUS FOR MEMORY AND DATA TRANSMISSION METHOD THEREOF

BACKGROUND

Field of the Invention

The invention relates to a data transmission apparatus and method thereof particularly, the invention relates to the data transmission apparatus and method thereof with a two-stage structure.

Description of Related Art

Referring to FIG. 1, which illustrates a circuit plot of a data transmission apparatus of a memory in conventional art. In conventional art, a main array 110 is coupled to a page buffer 120 and provides data for read-out operation to a sense amplifier 130 through the page buffer 120. The sense amplifier 130 senses the data and provides a sensed data to a shift register 140. The shift register 140 receives and latches the sensed data, and shifts out the sensed data bit by bit according to a clock signal CLK, and directly provides the shift-out data to a plurality of pads PD1-PD4.

The budget for data propagation from the shift register 140 to the pads PD1-PD4 is half clock cycle (½ CLK). The data propagation can limit speed of the design, in particular in case of a big die size where data propagation from shift register 140 to the pads PD1-PD4 could become the bottle neck for max speed.

SUMMARY OF THE INVENTION

The disclosure is directed to a data transmission apparatus and method for a memory, which can improve throughput for data readout operation.

The disclosure provides the data transmission apparatus for a memory. The data transmission apparatus includes a prior stage shift register circuit and a plurality of rear stage shift register circuits. The prior stage shift register circuit is coupled to a sense amplifying device of the memory, receives sensed data from the sense amplifying device and outputs a plurality of the readout data in series by bitwise shifting out the sensed data according to a shift clock signal. The plurality of rear stage shift register circuits are coupled to the prior stage shift register circuit and respectively coupled to a plurality of pads. The plurality of rear stage shift register circuits respectively receive the readout data and respectively bitwise providing the readout data to the pads according to a clock signal. Wherein, a frequency of the shift clock signal is less than a frequency of the clock signal.

The disclosure further provides the data transmission method for the memory. The data transmission method includes: receiving sensed data from the sense amplifying device by a prior stage shift register circuit; outputting a plurality of the readout data in series by bitwise shifting out the sensed data according to a shift clock signal by the prior stage shift register circuit; and, respectively receiving the readout data and respectively bitwise providing the readout data to the pads according to a clock signal by a plurality of rear stage shift register circuits. Wherein the frequency of the clock signal to generate the shift clock signal.

According to the above descriptions, the present disclosure divides a data transmission path of a data-readout operation into two stages, and a data propagation time can be increased accordingly. By increasing a latency to transmit the read-out data, the throughput of the data-readout operation can be improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
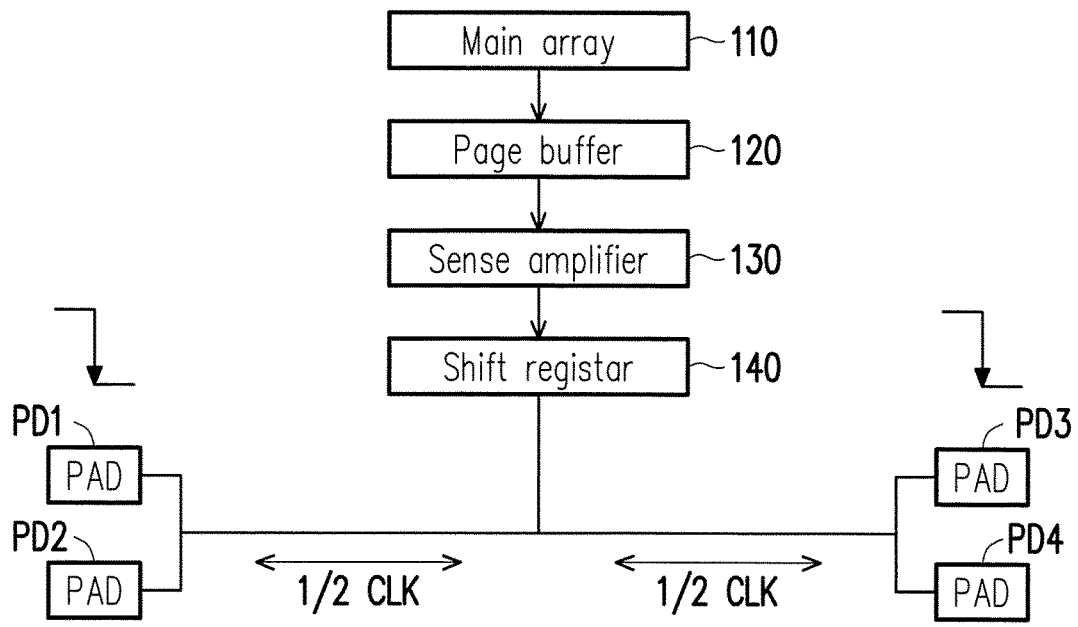
FIG. 1 illustrates a circuit plot of a data transmission apparatus of a memory in conventional art.
Figure 2:
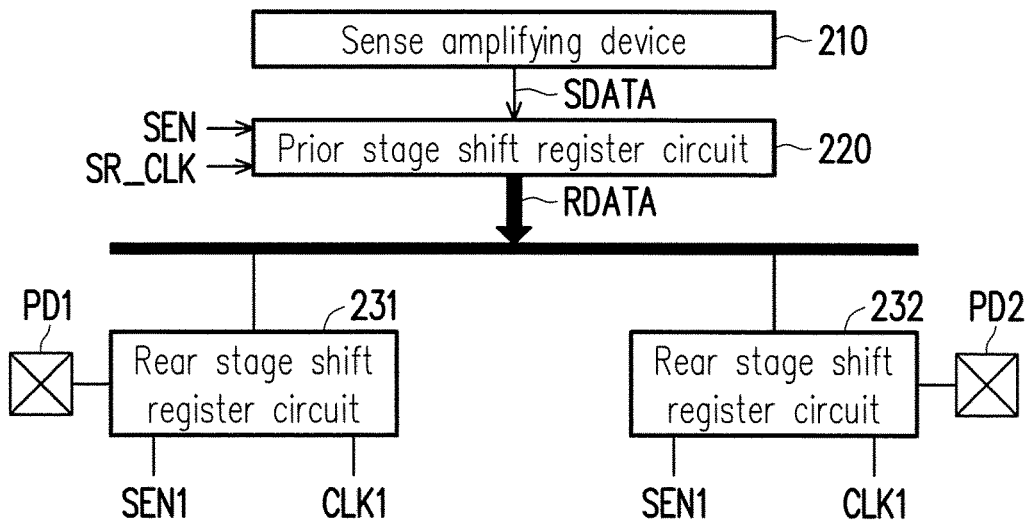
FIG. 2 illustrates a schematic diagram of a data transmission apparatus for a memory according to an embodiment of present disclosure.

Referring to FIG. 2, which illustrates a schematic diagram of a data transmission apparatus for a memory according to an embodiment of present disclosure. The data transmission apparatus 200 includes a sense amplifying device 210, a prior stage shift register circuit 220 and a plurality of rear stage shift register circuits 231-232. The prior stage shift register circuit 220 is coupled to a sense amplifying device 210 of the memory. The prior stage shift register circuit 220 receives sensed data SDATA from the sense amplifying device 210 and outputs a plurality of the readout data RDATA in series by bitwise shifting out the sensed data according to a shift clock signal SR_CLK. The rear stage shift register circuits 231 and 232 are coupled to the prior stage shift register circuit 220, and the rear stage shift register circuits 231 and 232 are respectively coupled to pads PD1 and PD2. The pads PD1 and PD2 are input output (I/O) pads in a chip for disposing the memory. The rear stage shift register circuits 231 and 232 receive the readout data RDATA, and respectively bitwise transport the readout data RDATA to the pads PD1 and PD2 according to a clock signal CLK1.

In detail, the prior stage shift register circuit 220 may latch the sensed data SDATA according to a latch signal SEN, and then shifts out the sensed data SDATA bit by bit to generated the readout data RDATA according to positive (or negative) edges of the shift clock signal SR_CLK. The readout data RDATA may be divided into two parts, and are respectively provided to the rear stage shift register circuits 231 and 232. The rear stage shift register circuits 231 and 232 respectively latch a first part of the readout data RDATA and a second part of the readout data RDATA. The rear stage shift register circuit 231 shifts out the first part of the readout data RDATA to the pad PD1 bit by bit according to the clock signal CLK1, and the rear stage shift register circuit 232 shifts out the second part of the readout data RDATA to the pad PD2 bit by bit according to the clock signal CLK1, too. Additional, the rear stage shift register circuits 231 and 232 shift out the readout data RDATA simultaneously.

Please be noted here, a frequency of the shift clock signal SR_CLK is less than a frequency of the clock signal CLK1. In this embodiment of present disclosure, the frequency of the shift clock signal SR_CLK can be determined by dividing the frequency of the clock signal CLK1. In some embodiment, the frequency of the shift clock signal SR_CLK may be one-half of the frequency of the clock signal CLK1.

Figure 3:
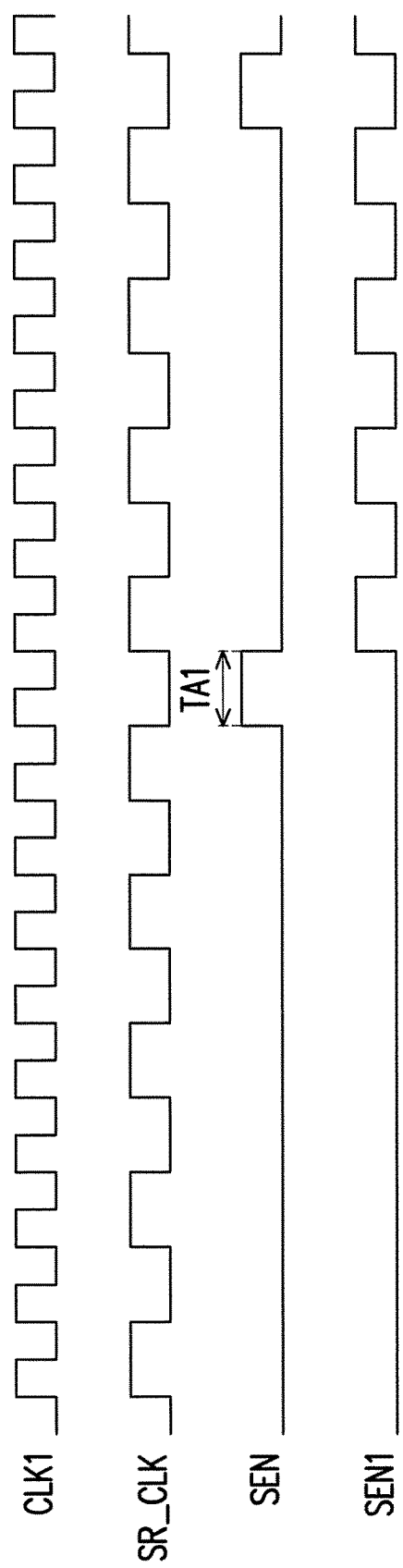
FIG. 3 illustrates a waveform plot of the data transmission apparatus of FIG. 2.

Referring to FIG. 2 and FIG. 3 commonly, FIG. 3 illustrates a waveform plot of the data transmission apparatus of FIG. 2. In FIG. 3, the shift clock signal SR_CLK is generated by a signal generator, and the signal generator can generate the shift clock signal SR_CLK with a frequency being one-half of the frequency of the clock signal CLK1. When the sensed data SDATA is ready, the latch signal SEN is pulled to logic high during a time period TA1 to latch the sensed data SDATA into the prior stage shift register circuit 220. Then, the readout data RDATA may be generated by shifting out the sensed data SDATA bit by bit by the prior stage shift register circuit 220 according to positive edges of the shift clock signal SR_CLK.

A hardware structure of the signal generator can be implemented by a frequency divided known by a person skilled in the art, and no more limitation here.

In this embodiment, after the time period TA1, the latch signal SEN1 is pulled logic high periodically at a frequency aligned with the frequency of the shift clock signal SR_CLK. The rear stage shift register circuits 231 and 232 latch the readout data RDATA while the latch signal SEN1 is at logic high, and then, the rear stage shift register circuits 231 and 232 can respectively shift out the first part and second part of the readout data RDATA to the pads PD1 and PD2 according to negative edges of the clock signal CLK1.

It should be noted here, number of the rear stage shift register circuits 231 and 232 is not limited to 2, and can be varied according to pads for input and output (I/O) data of the memory.

On the other hand, number of registers of the prior stage shift register circuit 220 is larger than number of all of the rear stage shift register circuits 231 and 232. In one embodiment of present disclosure, the prior stage shift register circuit 220 may include N shift registers, and each of the N shift registers may include M registers. That is, total number of registers of the prior stage shift register circuit 220 is N×M. If the number of the rear stage shift register circuits 231 and 232 is I and the number of registers of each of the rear stage shift register circuits 231 and 232 is J. Wherein, N=I×J, and N, M, I and J are positive integers.

In proposed disclosure, data transmission path is divided into two stages, so the data transmission apparatus 200 allows data propagation time to increase to one clock cycle of the clock signal CLK1. By present disclosure, even the readout operation is operated in a high speed mode, time budget for data transmission can also meet specification. That is, throughput of data transmission for the readout operation of the memory can be improved.

Figure 4:
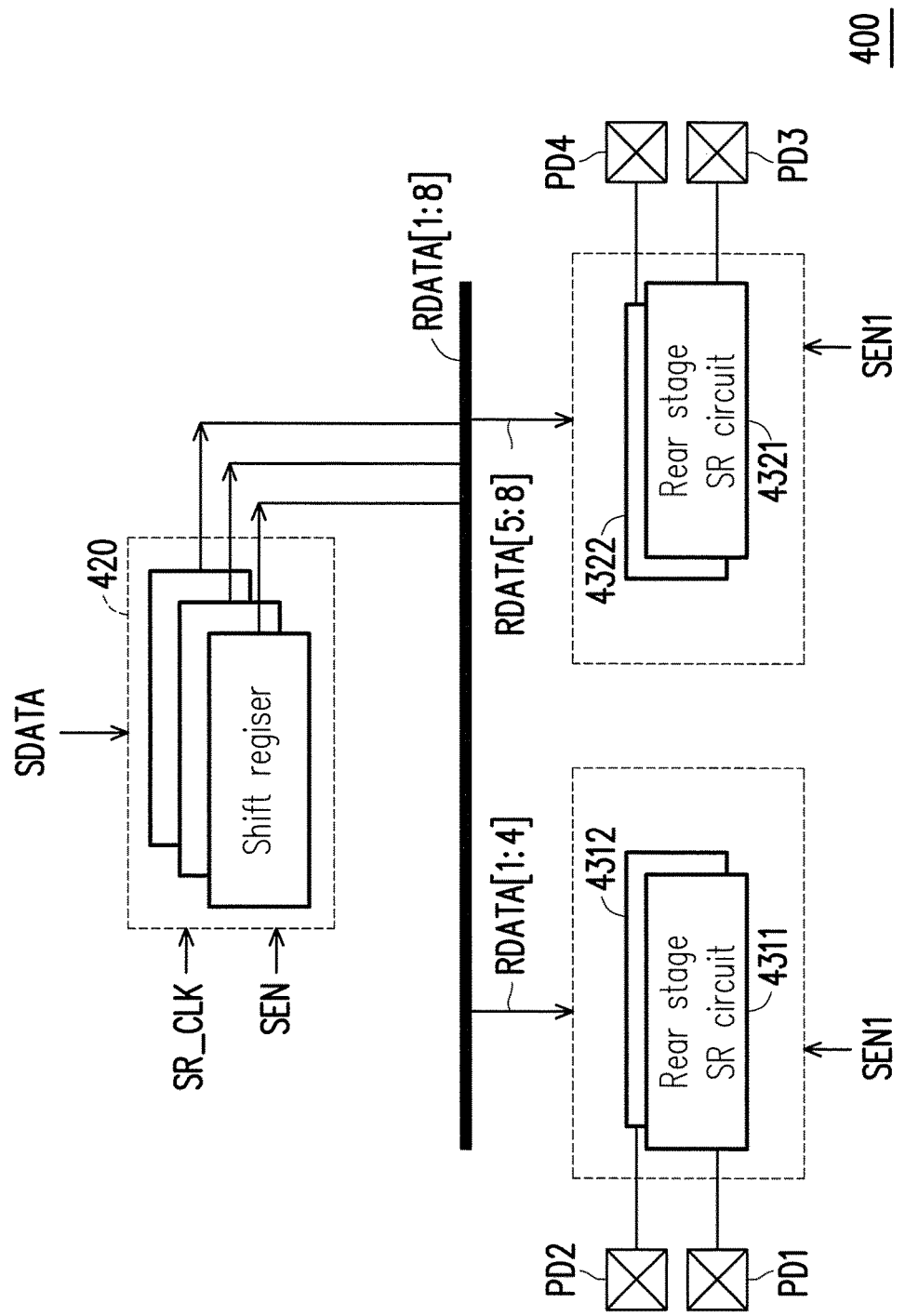
FIG. 4 illustrates a schematic diagram of a data transmission apparatus according to another embodiment of present disclosure.
Figure 5:
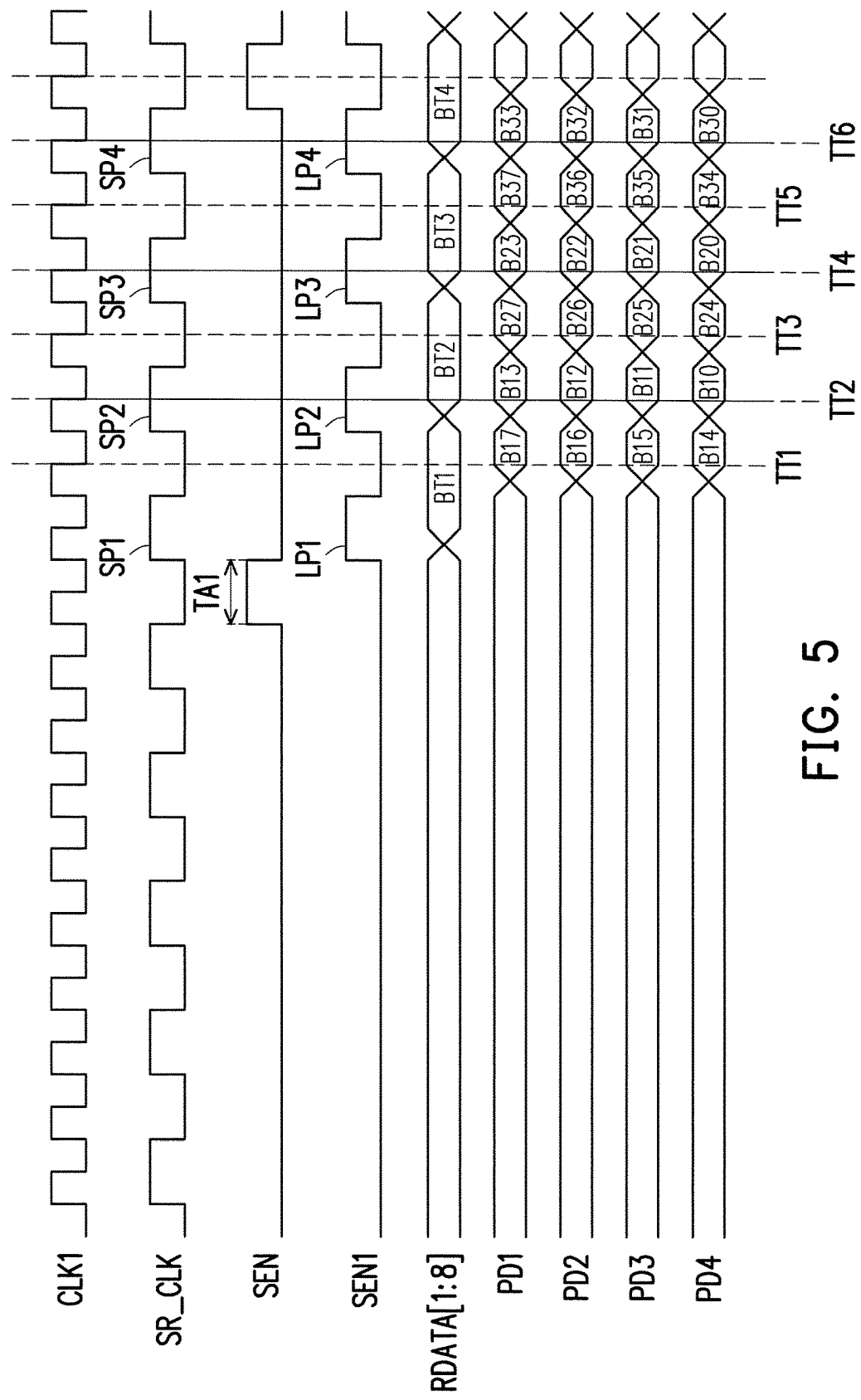
FIG. 5 illustrates a waveform plot of the data transmission apparatus in FIG. 4.

Referring to FIG. 4 which illustrates a schematic diagram of a data transmission apparatus according to another embodiment of present disclosure, and FIG. 5 which illustrates a waveform plot of the data transmission apparatus in FIG. 4 according to another embodiment of present disclosure. The data transmission apparatus 400 includes a prior stage shift register circuit 420 and a plurality of rear stage shift register (SR) circuits 4311, 4312, 4321 and 4322. The prior stage shift register circuit 420 includes a plurality of shift registers, and in this embodiment, number of the shift registers in the prior stage shift register circuit 420 may be 8. The prior stage shift register circuit 420 latches sensed data SDATA from sense amplifying device according to a latch signal SEN, and shifts out the SDATA bit by bit according to the shift clock signal SR_CLK. Since the prior stage shift register circuit 420 includes eight shift registers operating in parallel, readout data RDATA[1:8] can be generated and respectively transmitted by eight wires.

The readout data RDATA[1:8] can be divided into first readout data RDATA[1:4] and second readout data RDATA[5:8]. The first readout data RDATA[1:4] may be provided to the rear stage SR circuits 4311 and 4312, and the second readout data RDATA[5:8] may be provided to the rear stage SR circuits 4321 and 4322, wherein the rear stage SR circuits 4311, 4312, 4321 and 4322 are respectively coupled to pads PD1, PD2, PD3 and PD4. Each of the rear stage SR circuits 4311, 4312, 4321 and 4322 latches 2 bits of the readout data RDATA[1:8] according to the latch signal SEN1.

Moreover, in this embodiment, number of registers in each of the shift registers of the prior stage shift register circuit 420 may be 4, and number of registers of each of the rear stage SR circuits 4311, 4312, 4321 and 4322 may be 2.

In the operation, referring to FIG. 5, sensed data SDATA is latched according to the latch signal SEN during a time period TA1. Then a first part (=BT1) of the readout data RDATA[1:8] can be generated by shift out the sensed data SDATA latched in the prior stage shift register circuit 420 according to a first pulse SP1 of the shift clock signal SR_CLK. The first part of the readout data RDATA[1:8] generated according to the first pulse SP1 of the shift clock signal SR_CLK can be latched into the rear stage SR circuits 4311, 4312, 4321 and 4322 according to a first pulse LP1 of the latch signal SEN1. The data latched in the rear stage SR circuits 4311, 4312, 4321 and 4322 can be shifted out at time points TT1 and TT2 in sequence, and data B14-B17 can be respectively obtained on the pads PD4-PD1 at the time point TT1, and data B10-B13 can be respectively obtained on the pads PD4-PD1 at the time point TT2.

After the time point TT1, second part (=BT2) of the readout data RDATA[1:8] can be generated by shift out the sensed data SDATA latched in the prior stage shift register circuit 420 according to a second pulse SP2 of the shift clock signal SR_CLK. The second part of the readout data RDATA[1:8] generated according to the second pulse SP2 of the shift clock signal SR_CLK can be latched into the rear stage SR circuits 4311, 4312, 4321 and 4322 according to a second pulse LP2 of the latch signal SEN1. The data latched in the rear stage SR circuits 4311, 4312, 4321 and 4322 can be shifted out at time points TT3 and TT4 in sequence, and data B24-B27 can be respectively obtained on the pads PD4-PD1 at the time point TT3, and data B20-B23 can be respectively obtained on the pads PD4-PD1 at the time point TT4.

After the time point TT3, third part (=BT3) of the readout data RDATA[1:8] can be generated by shift out the sensed data SDATA latched in the prior stage shift register circuit 420 according to a third pulse SP3 of the shift clock signal SR_CLK. The third part of the readout data RDATA[1:8] generated according to the third pulse SP3 of the shift clock signal SR_CLK can be latched into the rear stage SR circuits 4311, 4312, 4321 and 4322 according to a third pulse LP3 of the latch signal SEN1. The data latched in the rear stage SR circuits 4311, 4312, 4321 and 4322 can be shifted out at tune points TT5 and TT6 in sequence, and data B34-B37 can be respectively obtained on the pads PD4-PD1 at the time point TT5, and data B30-B33 can be respectively obtained on the pads PD4-PD1 at the time point TT6.

After the time point TT4, fourth part (=BT4) of the readout data RDATA[1:8] can be generated by shift out the sensed data SDATA latched in the prior stage shift register circuit 420 according to a fourth pulse SP4 of the shift clock signal SR_CLK. The fourth part of the readout data RDATA [1:8] generated according to the fourth pulse SP4 of the shift clock signal SR_CLK can be latched into the rear stage SR circuits 4311, 4312, 4321 and 4322 according to a fourth pulse LP4 of the latch signal SEN1. The data latched in the rear stage SR circuits 4311, 4312, 4321 and 4322 can be shifted out at flow-up two time points in sequence, and the data (=BT4) can be obtained on pads PD1-PD4.

Figure 6:
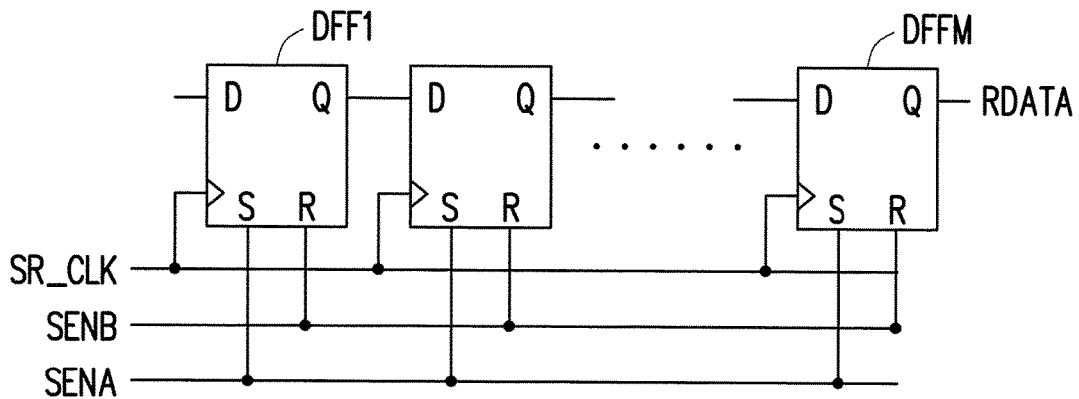
FIG. 6, which illustrates a schematic diagram of a shift register circuit according an embodiment of present disclosure.

Referring to FIG. 6, which illustrates a schematic diagram of a shift register circuit according an embodiment of present disclosure. Take the shift register of the prior stage shift register circuit as an example here. The shift register 600 may be implemented by a plurality of D-type flip-flops DFF1-DFFM. Each of the D-type flip-flops DFF1-DFFM may have a data end D, output end Q, set end S, reset end R and clock end. The D-type flip-flops DFF1-DFFM are coupled in series, the clock ends of all of the D-type flip-flops DFF1-DFFM receive the shift clock signal SR_CLK, the set ends of all of the D-type flip-flops DFF1-DFFM receive a latch signal SENA, and the reset ends of all of the D-type flip-flops DFF1-DFFM receive another latch signal SENB. The latch signals SENA and SENB are generated by logic level of data which need to be latched into the corresponding D-type flip-flop. If the logic level of latched data is "1", the latch signal SENA may be enabled and the latch signal SENB may be disabled, and if the logic level of latched data is "0", the latch signal SENB may be enabled and the latch signal SENA may be disabled. Furthermore, if no data needs to be latched into the corresponding D-type flip-flop, both of the latch signals SENA and SENB are disabled.

Figure 7:
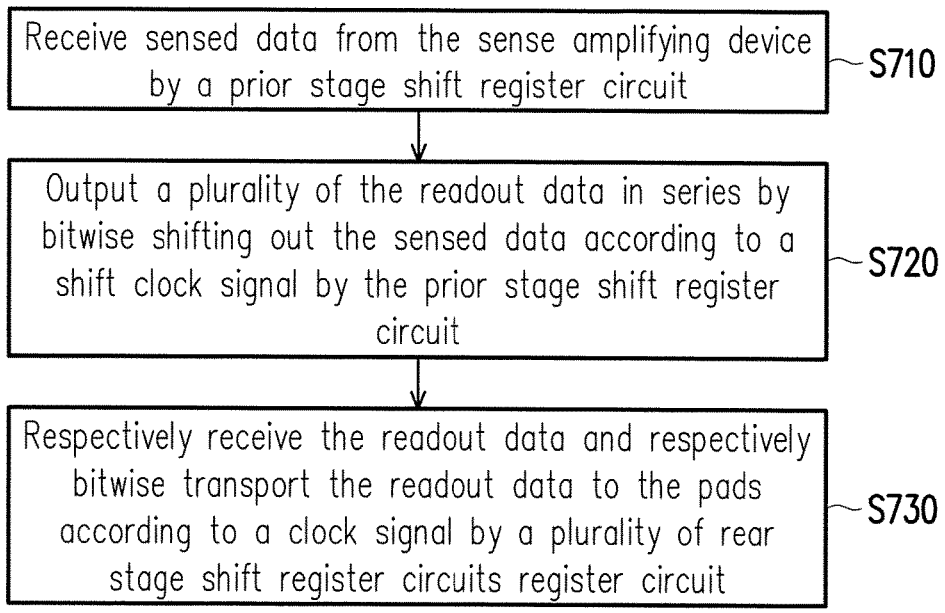
FIG. 7 illustrates a flow chart of data transmission method for a memory according to an embodiment of present disclosure.

Referring to FIG. 7, which illustrates a flow chart of data transmission method for a memory according to an embodiment of present disclosure. The data transmission method includes: receiving sensed data from the sense amplifying device by a prior stage shift register circuit (step S710); outputting a plurality of the readout data in series by bitwise shifting out the sensed data according to a shift clock signal by the prior stage shift register circuit (step S720); and respectively receiving the readout data and respectively bitwise providing the readout data to the pads according to a clock signal by a plurality of rear stage shift register circuits (S730). Wherein, a frequency of the shift clock signal is less than a frequency of the clock signal.

Details about the steps S710-S730 have been described in above embodiments, and no more repeated description here.

In summary, the present disclosure provides a two-stage structure of the data transmission apparatus for a memory. Throughput of the readout operation can be improved by increasing data propagation time.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data transmission apparatus for a memory, comprising:
   a prior stage shift register circuit, coupled to a sense amplifying device of the memory, receiving sensed data from the sense amplifying device and outputting a plurality of the readout data in series by bitwise shifting out the sensed data according to a shift clock signal; and
   a plurality of rear stage shift register circuits, coupled to the prior stage shift register circuit and respectively coupled to a plurality of pads, respectively receiving the readout data and respectively bitwise providing the readout data to the pads according to a clock signal,
   wherein, a frequency of the shift clock signal is less than a frequency of the clock signal.

2. The data transmission apparatus as claimed in claim 1, wherein the prior stage shift register circuit receives the sensed data from the sense amplifying device and latches the sensed data according to a first latch signal.

3. The data transmission apparatus as claimed in claim 2, wherein the prior stage shift register circuit comprises:
   N shift registers, wherein each of the N shift registers has M first registers, and the M first registers respectively latches M bits of the sensed data according to the first latch signal, and the N shift registers output N readout data in parallel,
   wherein N and M are positive integers.

4. The data transmission apparatus as claimed in claim 3, wherein number of the rear stage shift register circuits is I, and each of the rear stage register circuits has J second registers,
   wherein, I and J are positive integers and N=I×J.

5. The data transmission apparatus as claimed in claim 4, wherein each of the rear stage shift register circuits latches J bits of the N readout data in parallel according to a second latch signal.

6. The data transmission apparatus as claimed in claim 5, wherein the second latch signal is pulled logic high periodically at a frequency aligned with the frequency of the shift clock signal after the sensed data being latched to the prior stage shift register circuit.

7. The data transmission apparatus as claimed in claim 1, further comprising:
   a signal generator, receiving the clock signal and generating the shift clock signal by dividing the frequency of the clock signal.

8. A data transmission method for a memory, comprising:
   receiving sensed data from the sense amplifying device by a prior stage shift register circuit;
   outputting a plurality of the readout data in series by bitwise shifting out the sensed data according to a shift clock signal by the prior stage shift register circuit; and
   respectively receiving the readout data and respectively bitwise providing the readout data to the pads according to a clock signal by a plurality of rear stage shift register circuits,
   wherein, a frequency of the shift clock signal is less than a frequency of the clock signal.

9. The data transmission method as claimed in claim 8, wherein a step of receiving sensed data from the sense amplifying device by the prior stage shift register circuit comprises:

latching the sensed data according to a first latch signal by the prior stage shift register circuit.

10. The data transmission method as claimed in claim 9, wherein a step of respectively receiving the readout data and respectively bitwise providing the readout data to the pads according to the clock signal by the plurality of rear stage shift register circuits comprises:

latching the readout data according to a second latch signal by the plurality of rear stage shift register circuits.

11. The data transmission method as claimed in claim 10, wherein the second latch signal is pulled logic high periodically at a frequency aligned with the frequency of the shift clock signal after the sensed data being latched to the prior stage shift register circuit.

12. The data transmission method as claimed in claim 8, further comprising:

dividing the frequency of the clock signal to generate the shift clock signal.

* * * * *